(12) United States Patent
Yang

(10) Patent No.: US 9,954,035 B2
(45) Date of Patent: Apr. 24, 2018

(54) ORGANIC LIGHT EMITTING DIODE WITH A PLURALITY COMPOSITE ELECTRODE HAVING DIFFERENT THICKNESSES

(71) Applicant: BOE TECHNOLOGY GROUP CO., LTD., Beijing (CN)

(72) Inventor: Yifan Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/226,309

(22) Filed: Aug. 2, 2016

(65) Prior Publication Data

US 2017/0243928 A1 Aug. 24, 2017

(30) Foreign Application Priority Data

Feb. 24, 2016 (CN) .......................... 2016 1 0101909

(51) Int. Cl.
*H01L 27/32* (2006.01)
*H01L 51/52* (2006.01)
*H01L 51/56* (2006.01)

(52) U.S. Cl.
CPC ...... *H01L 27/3211* (2013.01); *H01L 27/3246* (2013.01); *H01L 51/5206* (2013.01); *H01L 51/5218* (2013.01); *H01L 51/5265* (2013.01); *H01L 51/5271* (2013.01); *H01L 51/56* (2013.01); *H01L 2227/323* (2013.01)

(58) Field of Classification Search
CPC ............. H01L 27/3211; H01L 51/5206; H01L 51/5218; H01L 27/3246; H01L 51/5265; H01L 51/5271; H01L 51/56
See application file for complete search history.

(56) References Cited

U.S. PATENT DOCUMENTS

| 7,030,553 | B2 | 4/2006 | Winters et al. |
| 7,510,455 | B2 | 3/2009 | Suzuki |
| 8,907,329 | B2 * | 12/2014 | Kurata ................. H01L 27/3211 257/40 |
| 8,933,471 | B2 * | 1/2015 | Kurata ................. H01L 27/3211 257/40 |
| 2011/0241000 | A1 * | 10/2011 | Choi ................... H01L 51/5265 257/59 |

(Continued)

FOREIGN PATENT DOCUMENTS

| CN | 1638547 A | 7/2005 |
| CN | 1839478 A | 9/2006 |

OTHER PUBLICATIONS

Chinese Office Action dated Feb. 26, 2018.

*Primary Examiner* — Alonzo Chambliss
(74) *Attorney, Agent, or Firm* — Dilworth & Barrese, LLP; Michael J. Musella, Esq.

(57) ABSTRACT

An organic light-emitting diode (OLED) array substrate, a display device and a manufacturing method thereof are disclosed. The array substrate includes: a substrate and pixel units disposed on the substrate. Each pixel unit includes a plurality of subpixel units; each subpixel unit includes a composite electrode, an organic material functional layer and a first electrode sequentially disposed on the substrate; thicknesses of the composite electrodes of different subpixel units are different; and the composite electrode, the organic material functional layer and the first electrode in a same subpixel unit constitute a microcavity structure.

16 Claims, 12 Drawing Sheets

(56) References Cited

U.S. PATENT DOCUMENTS

| | | | | |
|---|---|---|---|---|
| 2012/0241780 A1* | 9/2012 | Kurata | ............... | H01L 27/3211 257/89 |
| 2013/0146861 A1* | 6/2013 | Kurata | ............... | H01L 27/3211 257/40 |
| 2014/0239272 A1* | 8/2014 | Kim | ................... | H01L 51/5218 257/40 |
| 2015/0014661 A1* | 1/2015 | Joo | ................... | H01L 27/3211 257/40 |
| 2015/0171379 A1* | 6/2015 | Min | ....................... | H01L 51/56 257/40 |
| 2016/0172423 A1* | 6/2016 | Nendai | .............. | H01L 27/3246 257/40 |

* cited by examiner

ORGANIC LIGHT EMITTING DIODE WITH A PLURALITY COMPOSITE ELECTRODE HAVING DIFFERENT THICKNESSES

TECHNICAL FIELD

Embodiments of the present invention relate to an organic light-emitting diode (OLED) array substrate, a display device and a manufacturing method thereof.

BACKGROUND

OLED display device has the advantages of ultra-light and ultra-thin design, high brightness, large viewing angle, low voltage, low power consumption, rapid response, high resolution, shock resistance, flexibility, low cost, simple process, less used raw materials, high luminous efficiency, wide temperature range and the like, and is considered as the most promising new-generation display technology.

SUMMARY

An embodiments of the present invention provides an organic light-emitting diode (OLED) array substrate, comprising: a substrate and pixel units disposed on the substrate, wherein each pixel unit comprises a plurality of subpixel units; each subpixel unit comprises a composite electrode, an organic material functional layer and a first electrode sequentially disposed on the substrate; thicknesses of composite electrodes of the subpixel units are different; and the composite electrode, the organic material functional layer and the first electrode in a same subpixel unit constitute a microcavity structure.

In one embodiment of the present invention, for example, the plurality of subpixel units comprise a red (R) subpixel unit, a green (G) subpixel unit, and a blue (B) subpixel unit.

In one embodiment of the present invention, for example, the composite electrode of the R subpixel unit comprises an R second electrode, an R first microcavity adjustment layer, an R second microcavity adjustment layer and an R reflecting layer sequentially disposed on the substrate; the composite electrode of the G subpixel unit comprises a G second electrode, a G second microcavity adjustment layer and a G reflecting layer sequentially disposed on the substrate; the composite electrode of the B subpixel unit comprises a B second electrode and a B reflecting layer sequentially disposed on the substrate; and the first electrode is a transflective layer.

In one embodiment of the present invention, for example, the composite electrode of the R subpixel unit comprises an R second electrode, an R first microcavity adjustment layer, an R second microcavity adjustment layer and an R transflective layer sequentially disposed on the substrate; the composite electrode of the G subpixel unit comprises a G second electrode, a G second microcavity adjustment layer and a G transflective layer sequentially disposed on the substrate; the composite electrode of the B subpixel unit comprises a B second electrode and a B transflective layer sequentially disposed on the substrate; and the first electrode is a reflecting layer.

In one embodiment of the present invention, for example, each subpixel unit further comprises a connecting layer; and each connecting layer is bonded to the substrate.

In one embodiment of the present invention, for example, a material of the connecting layer comprises metal oxide.

In one embodiment of the present invention, for example, a material of the first microcavity adjustment layer comprises a metal oxide, and a material of the second microcavity adjustment layer comprises an inorganic passivation layer material.

In one embodiment of the present invention, for example, the array substrate further comprises a pixel define layer (PDL) disposed on the substrate and configured to separate any two adjacent subpixel units.

An embodiments of the present invention provides a display device, comprising an OLED array substrate as described above.

An embodiments of the present invention provides a manufacturing method of an OLED array substrate, comprising: forming a plurality of subpixel units on a substrate, wherein, each subpixel unit comprises a composite electrode formed on the substrate, an organic material functional layer formed on the composite electrode, and a first electrode formed on the organic material functional layer; thicknesses of composite electrodes of the subpixel units are different; and the composite electrode, the organic material functional layer and the first electrode in a same subpixel unit constitute a microcavity structure.

In one embodiment of the present invention, for example, in the manufacturing method, the plurality of subpixel units comprise a red (R) subpixel unit, a green (G) subpixel unit, and a blue (B) subpixel unit.

In one embodiment of the present invention, for example, in the manufacturing method, the substrate comprises a first region for accommodating the R subpixel unit, a second region for accommodating the G subpixel unit and a third region for accommodating the B subpixel unit; forming the composite electrodes on the substrate includes: forming a reflecting layer on the substrate, forming a second microcavity adjustment layer on the reflecting layer, and forming a first microcavity adjustment layer on the second microcavity adjustment layer; etching the first microcavity adjustment layer located in the second region and the third region, and exposing the second microcavity adjustment layer located in the second region and the third region; etching the second microcavity adjustment layer located in the third region, and exposing the reflecting layer located in the third region; and forming a second electrode on the first microcavity adjustment layer located in the first region, on the second microcavity adjustment layers located in the second region, and on the reflecting layers located in the third region; and the first electrode is a transflective layer.

In one embodiment of the present invention, for example, in the manufacturing method, before forming the reflecting layer on the substrate, further comprising: forming a connecting layer on the substrate.

In one embodiment of the present invention, for example, in the manufacturing method, the substrate comprises a first region for accommodating the R subpixel unit, a second region for accommodating the G subpixel unit and a third region for accommodating the B subpixel unit; forming the composite electrodes on the substrate includes: forming a transflective layer on the substrate, forming a second microcavity adjustment layer on the transflective layer, and forming a first microcavity adjustment layer on the second microcavity adjustment layer; etching the first microcavity adjustment layer located in the second region and the third region, and exposing the second microcavity adjustment layer located in the second region and the third region; etching the second microcavity adjustment layer located in the third region, and exposing the transflective layer located in the third region; and forming a second electrode on the first microcavity adjustment layer located in the first region, on the second microcavity adjustment layer located in the second region, and on the transflective layer located in the third region; and the first electrode is a reflecting layer.

In one embodiment of the present invention, for example, in the manufacturing method, before forming the transflective layer on the substrate, further comprising: forming a connecting layer on the substrate.

In one embodiment of the present invention, for example, in the manufacturing method, a material of the connecting layer comprises a metal oxide.

In one embodiment of the present invention, for example, in the manufacturing method, a material of the first microcavity adjustment layer comprises a metal oxide, and a material of the second microcavity adjustment layer comprises an inorganic passivation layer material.

In one embodiment of the present invention, for example, in the manufacturing method, before forming the organic material functional layer on the composite electrode, further comprising: separating any two adjacent subpixel units by etching, and exposing the substrate; and forming a PDL on the exposed substrate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

REFERENCE NUMBERS 1 substrate, 11 glass substrate, 12 inorganic buffer layer, 13 active layer, 14 interlayer insulating layer, 15 gate electrode, 16 gate insulating layer, 17 planarization layer, 18 first pole, 19 second pole, 2 pixel unit, 21 red (R) subpixel unit, 22 green (G) subpixel unit, 23 blue (B) subpixel unit, 3 pixel defining unit, 4 (R/G/B) second electrode, 5 (R) first microcavity adjustment layer, 6 (R/G) second microcavity adjustment layer, 71 reflecting layer, 72 connecting layer, 73 transflective layer, 8 organic material functional layer, 81 red organic material functional layer, 82 green organic material functional layer, 83 blue organic material functional layer, 9 (R/G) conductive layer, 10 first electrode, R first region, G second region, B third region.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Because OLED luminescent materials have wide luminescent bands and cannot satisfy the color purity requirement of required light sources, the luminous efficiency and the brightness of OLED are limited, and hence corresponding display devices have low contrast and poor display effect. The OLED display device mostly adopts a microresonator technology to improve the display effect.

The inventor of the present invention has noted that the conventional approaches at least have the following deficiencies: in a conventional OLED display device, microcavity structures of pixel units require a plurality of patterning processes, so that the manufacturing process is complicate and the yield is low, and hence the manufacturing cost is high and the production efficiency is low.

First Embodiment

Figure 1:
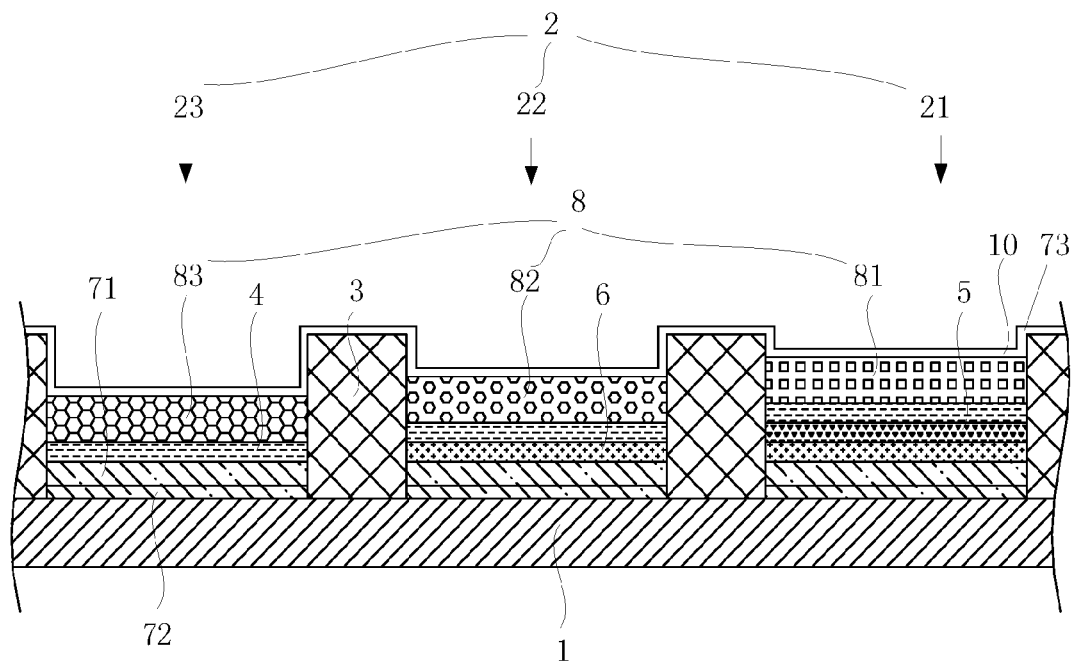
FIG. 1 is a schematic structural view of an OLED array substrate provided by an embodiment of the present invention.
Figure 2:
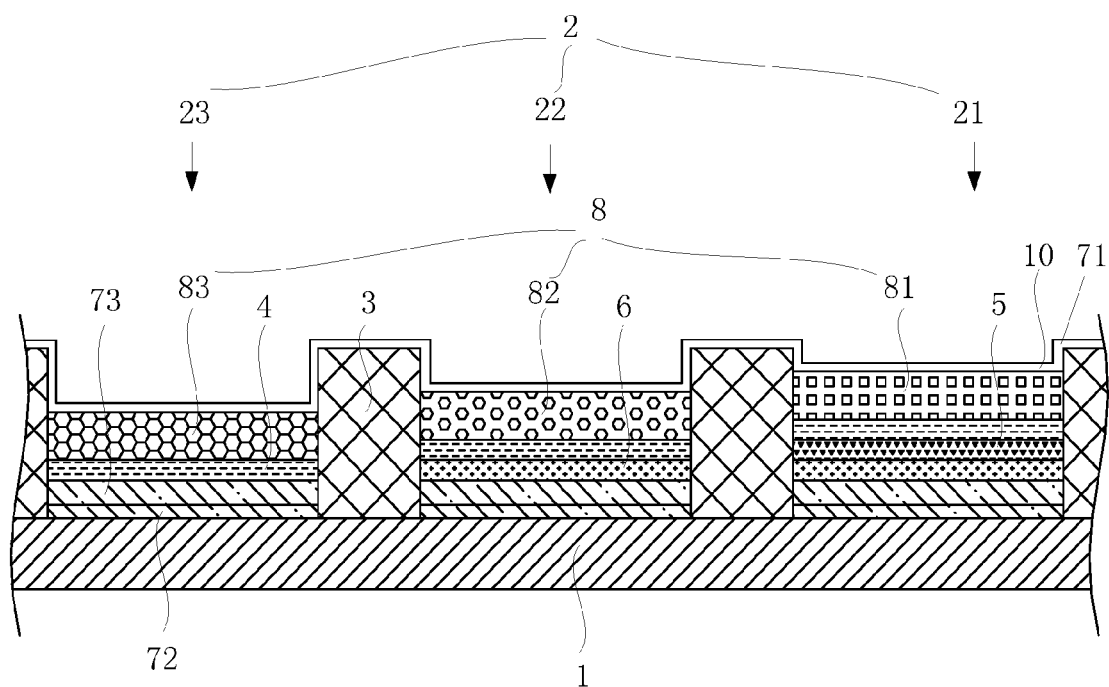
FIG. 2 is a schematic structural view of an OLED array substrate provided by an embodiment of the present invention.

The present embodiment provides an OLED array substrate. As illustrated in FIGS. 1 and 2, the array substrate comprises: a substrate 1 and a plurality of pixel units 2 disposed on the substrate 1. Each pixel unit 2 comprises a plurality of subpixel units 21, 22, 23.

Each pixel unit 2 comprises a composite electrode, an organic material functional layer 8 and a first electrode 10 sequentially disposed on the substrate 1. A thickness of the composite electrode of different types of subpixel units 21, 22, 23 is different. For instance, as illustrated in FIG. 1, the composite electrode of the R subpixel unit 21 comprises an R second electrode 4, an R first microcavity adjustment layer 5, an R second microcavity adjustment layer 6 and an R reflecting layer 71 sequentially disposed on the substrate 1; the composite electrode of the G subpixel unit 22 comprises a G second electrode 4, a G second microcavity adjustment layer 6 and a G reflecting layer 71 sequentially disposed on the substrate 1; and the composite electrode of the B subpixel unit 23 comprises a B second electrode 4 and a B reflecting layer 71 sequentially disposed on the substrate 1.

The composite electrode, the organic material functional layer 8 and the first electrode 10 in a same subpixel unit 21, 22 or 23 constitute a microcavity structure.

In the OLED array substrate provided by the embodiment of the present invention, a plurality of subpixel units 21, 22, 23 are disposed on the substrate 1; the thickness of the composite electrodes of different types of subpixel units 21, 22, 23 is different; and the microcavity structure is formed by the composite electrode, the organic material functional layer 8 and the first electrode 10 in the same subpixel unit 21, 22 or 23. Thus, the thickness of the microcavity structures of different types of subpixel units 21, 22, 23 is different. The manufacturing process of the microstructures is simple and the array substrate can be easily obtained, so that the manufacturing cost can be reduced and the production efficiency and the yield can be improved.

In one embodiment of the present invention, for instance, the plurality of pixel units 2 comprise R, G and B subpixel units. Because the wavelengths of light emitted by the R, G and B subpixel units 21, 22, 23 are different from each other, the thickness of three types of microcavity structures corresponding to the R, G and B subpixel units 21, 22, 23 also should be different. The three types of microcavity structures are configured to improve the color purity and intensity of light emitted by corresponding subpixel units 21, 22, 23.

As illustrated in FIGS. 1 and 2, for instance, the organic material functional layers 8 of the R, G and B subpixel units 21, 22, 23 are respectively a red (R) organic material functional layer 81, a green (G) organic material functional layer 82 and a blue (B) organic material functional layer 83; the R organic material functional layer 81 is disposed on the R second electrode 4 of the R subpixel unit 21; the G organic material functional layer 82 is disposed on the G second electrode 4 of the G subpixel unit 22; the B organic material functional layer 83 is disposed on the B second electrode 4 of the B subpixel unit 23; the R organic material functional layer 81 is configured to emit red light; the G organic material functional layer 82 is configured to emit green light; and the B organic material functional layer 83 is configured to emit blue light. Due to the subpixel units 21, 22, 23, the color purity and the intensity of light emitted by corresponding organic material functional layers 8 can be improved. For instance, due to the microcavity effect of the R subpixel unit 21, the color purity and the intensity of the red light emitted by the R organic material functional layer 81 are improved.

The OLED array substrate provided by the embodiment can be applied in top-emission and bottom-emission OLED array substrates.

For instance, the first electrode 10 is a transflective layer 73. The light emitted by the organic material functional layer 8 emit from the first electrode 10, namely emit from the transflective layer 73. The light emitted by the organic material functional layer 8 cannot emit from the reflecting layer 71. The structure is a top-emission OLED array substrate.

Figure 15:
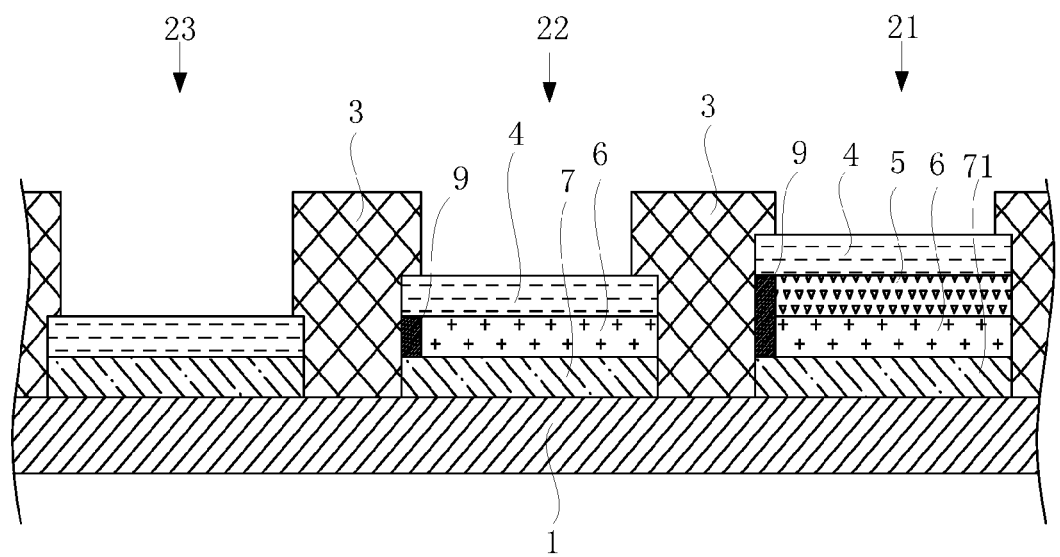

As illustrated in FIG. 15, in order to conduct the R reflecting layer 71 and the R second electrode 4 of the R subpixel unit 21, an R conductive layer 9 should be disposed between the R first microcavity adjustment layer 5 and the R second microcavity adjustment layer 6 of the R subpixel unit 21. One end of the R conductive layer 9 is connected with the R second electrode 4, and the other end is connected with the R reflecting layer 71. In order to conduct the G reflecting layer 71 and the G second electrode 4 of the G subpixel unit 22, a G conductive layer 9 should be disposed in the G second microcavity adjustment layer 6 of the G subpixel unit 22. One end of the G conductive layer 9 is connected with the G second electrode 4, and the other end is connected with the G reflecting layer 71.

As illustrated in FIG. 1, for instance, each subpixel unit further comprises a connecting layer 72. The connecting layer 72 of each subpixel unit is disposed between the reflecting layer 71 and the substrate 1. Due to the connecting layer 72, the bonding strength of the reflecting layer 71 and the substrate 1 can be enhanced, so that the reflecting layer 71 can be more stably connected to the substrate 1.

As illustrated in FIG. 2, in one embodiment of the present invention, for instance, the composite electrode of the R subpixel unit 21 comprises an R second electrode 4, an R first microcavity adjustment layer 5, an R second microcavity adjustment layer 6 and an R transflective layer 73 sequentially disposed on the substrate 1;

the composite electrode of the G subpixel unit 22 comprises a G second electrode 4, a G second microcavity adjustment layer 6 and a G transflective layer 73 sequentially disposed on the substrate 1; and the composite electrode of the B subpixel unit 23 comprises a B second electrode 4 and a B transflective layer 73 sequentially disposed on the substrate 1.

For instance, the first electrode 10 is a reflecting layer 71. The light emitted by the organic material functional layer 8 may emit from the transflective layer 73 and cannot emit from the first electrode 10. The structure is a bottom-emission OLED array substrate.

Figure 25:
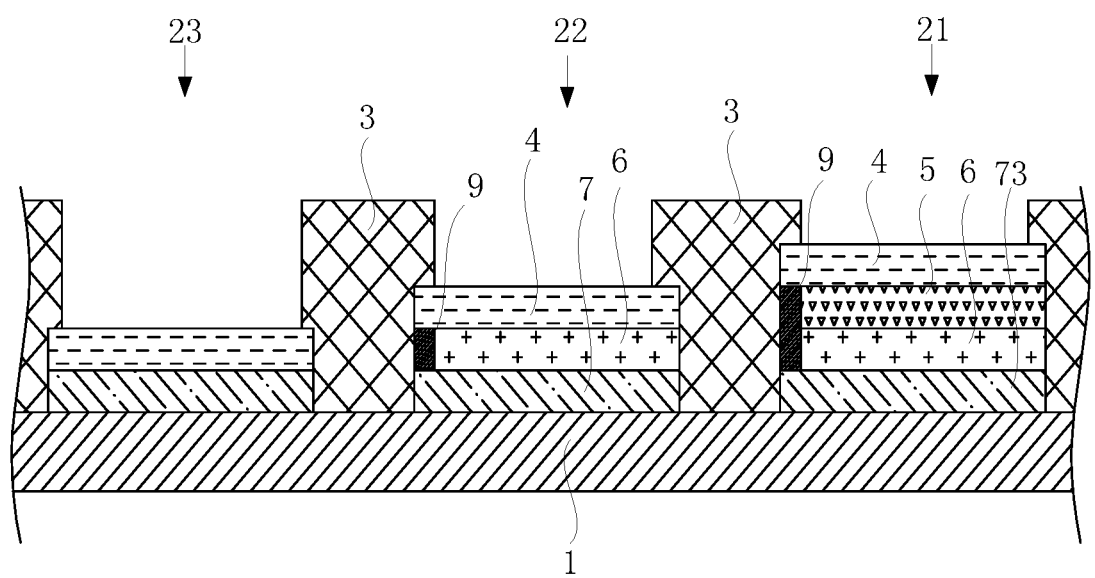

As illustrated in FIG. 25, in order to conduct the transflective layer 73 and the R second electrode 4 of the R subpixel unit 21, an R conductive layer 9 is disposed in the R first microcavity adjustment layer 5 and the R second microcavity adjustment layer 6 of the R subpixel unit 21. One end of the R conductive layer 9 is connected with the R second electrode 4, and the other end is connected with the R transflective layer 73. In order to conduct the G transflective layer 73 and the G second electrode 4 of the G subpixel unit 22, a G conductive layer 9 is disposed in the G second microcavity adjustment layer 6 of the G subpixel unit 22. One end of the G conductive layer 9 is connected with the G second electrode 4, and the other end is connected with the G transflective layer 73.

As illustrated in FIG. 2, for instance, each subpixel unit further includes a connecting layer 72 which is disposed between the transflective layer 73 and the substrate 1. Due to the connecting layer 72, the bonding property of the transflective layer 73 and the substrate 1 can be enhanced, so that the transflective layer 73 can be more stably connected to the substrate 1.

In the embodiment, the number of the structural layers of the G subpixel unit 23 is minimum; the number of the structural layers of the G subpixel unit 22 is greater than the number of the structural layers of the B subpixel unit 23; and the number of the structural layers of the R subpixel unit 21 is maximum. Three types of microcavity structures with different thicknesses corresponding to the R, G and B subpixel units can be obtained due to different numbers of the structural layers of the R, G and B subpixel units 21, 22, 23.

In the embodiment, when the plurality of pixel units 2 are formed on the substrate 1, firstly, the reflecting layer 71 or the transflective layer 73 is sputtered on the substrate 1; secondly, the second microcavity adjustment layer 6 and the first microcavity adjustment layer 5 are deposited on the substrate 1 in sequence; thirdly, the first microcavity adjustment layer 5 in the B subpixel units 23 and the G subpixel units 22 is etched, and the second microcavity adjustment layer 6 in the B subpixel units 23 and the G subpixel units 22 is exposed; fourthly, the second microcavity adjustment layer 6 in the B subpixel units 23 is etched, and the reflecting layer 71 or the transflective layer 73 is exposed; and finally, the second electrodes 4 are sputtered on the substrate 1. As can be seen, in the embodiment, multi-layer structures with different layers are formed on the substrate 1, so that the thickness of the composite electrodes of different pixel units 2 is different. Therefore, the OLED array substrate provided by the embodiment can be easily obtained, and as a result, the manufacturing cost is reduced and the production efficiency and the yield are improved.

For instance, a material of the connecting layer 72 comprises a metal oxide.

For instance, a metal oxide material of the connecting layer 72 comprises an indium tin oxide (ITO) or an indium zinc oxide (IZO).

For instance, a thickness of the connecting layer 72 is less than or equal to 20 nm.

For instance, a thickness of the transflective layer 73 is less than or equal to 20 nm.

For instance, a thickness of the reflecting layer 71 is greater than 50 nm.

For instance, a material of the first microcavity adjustment layer 5 comprises a metal oxide, and a material of the second microcavity adjustment layer 5 comprises an inorganic passivation layer material. Wherein, the inorganic passivation layer material of the second microcavity adjustment layer 6 comprises a silicon oxide or a silicon nitride, and the metal oxide of the first microcavity adjustment layer 5 comprises ITO or IZO. As the above materials are adopted, the index of refraction of the first microcavity adjustment layer 5 and the index of refraction of the second microcavity adjustment layer 6 are very close to each other and are ranged from 1.9 to 2.1.

For instance, a material of the second electrode 4 comprises a metal oxide.

For instance, a metal oxide material of the second electrode 4 comprises ITO or IZO.

For instance, a material of the reflecting layer 71 comprises a metallic material. The metallic material of the reflecting layer 71 shall have high reflectivity.

For instance, a material of the reflecting layer 71 is one metal selected from silver, tungsten and aluminum.

For instance, the substrate 1 may be a thin-film transistor (TFT) substrate.

Figure 3:
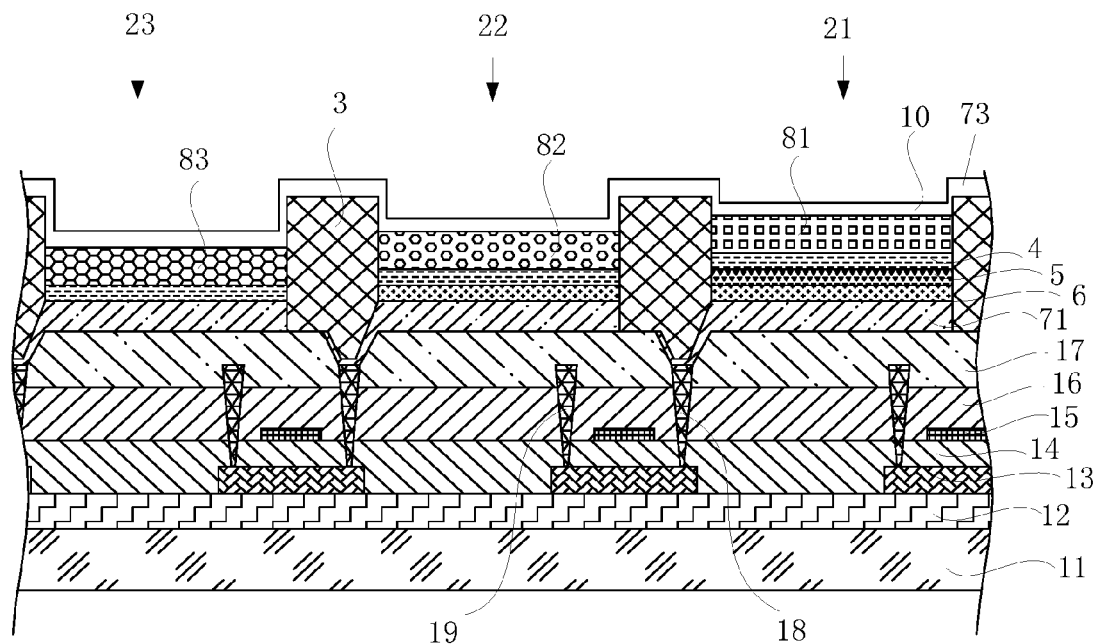
FIG. 3 is a schematic structural view of an OLED array substrate provided by an embodiment of the present invention.
Figure 4:
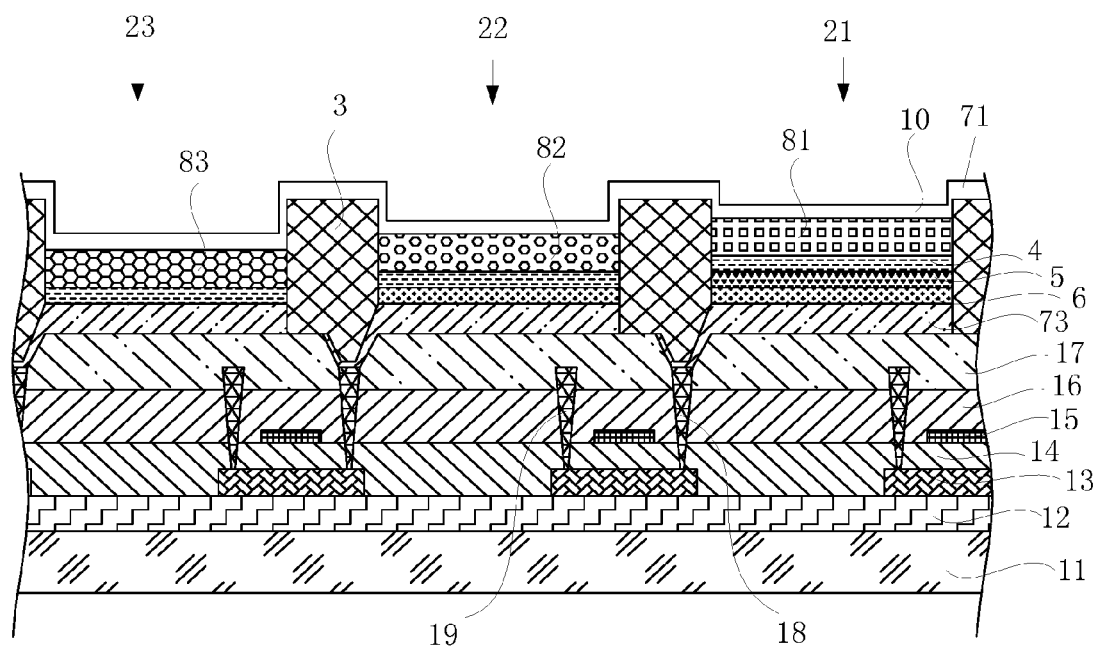
FIG. 4 is a schematic structural view of an OLED array substrate provided by an embodiment of the present invention.

As illustrated in FIGS. 3 and 4, for instance, the TFT substrate includes a glass substrate 11, an inorganic buffer layer 12, an active layers 13, an interlayer insulating layer 14, a gate electrodes 15, a gate insulating layer 16, a planarization layer 17, a first pole 18 and a second pole 19.

The inorganic buffer layer 12 is disposed on the glass substrate 11; the active layer 13 is disposed on the inorganic buffer layer 12; the interlayer insulating layer 14 is disposed on the active layers 13 and the inorganic buffer layer 12; the gate electrodes 15 is disposed on the interlayer insulating layer 14; the gate insulating layer 16 is disposed on the gate electrodes 15 and the interlayer insulating layer 14; the planarization layer 17 is disposed on the gate insulating layer 16; one end of the first pole is exposed out of the planarization layer 17, and the other end is connected with the active layer 13; and one end of the second pole 19 is disposed in the planarization layer 17, and the other end is connected with the active layer 13.

The reflecting layers 71 of the three subpixel units 21, 22, 23 of the top-emission OLED array substrate are all disposed on the planarization layer 17 and connected with the first pole 18. The transflective layers 73 of the three subpixel units 21, 22, 23 of the bottom-emission OLED array substrate are all disposed on the planarization layer 17 and connected with the first pole 18.

For instance, the first pole 18 is a source electrode, and the second pole 19 is a drain electrode; or the first pole 18 is a drain electrode, and the second pole 19 is a source electrode.

As illustrated in FIGS. 1 to 4, for instance, the array substrate further comprises a pixel defining layer (PDL) disposed on the substrate 1 and configured to separate any two adjacent subpixel units 21, 22, 23. For instance, the PDL includes pixel defining units 3.

For instance, the conductive layers 9 in both the R subpixel unit 21 and the G subpixel unit 22 are bonded to the pixel defining unit 3, and the distance between the conductive layers 9 and the pixel defining unit 3 is as smaller as possible. The size of an upper end of the pixel defining unit 3 is greater than that of a lower end of the pixel defining unit 3, so that the conductive layers 9 in the R subpixel unit 21 and the G subpixel unit 22 can be shielded, and hence the uniformity of light running through the R subpixel unit 21 and the G subpixel unit 22 can be improved.

For instance, a material of the conductive layer 9 may be the same with that of the second electrode 4.

In the OLED array substrate provided by the embodiment of the present invention, the R subpixel units 21, the G subpixel units 22 and the B subpixel units 23 are disposed on the substrate 1; the second microcavity adjustment layers 6 are disposed in the G subpixel units 22; and the first microcavity adjustment layers 5 and the second microcavity adjustment layers 6 are disposed in the R subpixel units 21. Thus, a thickness of the composite electrodes of the R subpixel units 21, the G subpixel units 22 and the B subpixel units 23 is different. The array substrate possessing the above structure can be easily obtained and has low manufacturing cost and high production efficiency and yield.

Second Embodiment

The embodiment of the present invention further provides a display device, which comprises the OLED array substrate provided by the first embodiment.

In the display device provided by the embodiment, the OLED array substrate thereof can be easily obtained and has low manufacturing cost and production efficiency and yield, so that the yield of the display device is high and the cost is low.

Third Embodiment

The embodiment of the present invention further provides a method for manufacturing an OLED array substrate. As illustrated in FIGS. 1 and 2, the manufacturing method comprises:

forming a plurality of pixel units 2 on a substrate 1, wherein, each pixel unit 2 comprises a composite electrode formed on the substrate 1, an organic material functional layer 8 formed on the composite electrode, and a first electrode 10 formed on the organic material functional layer 8; a thickness of the composite electrodes of different types of pixel units 2 is different; and the composite electrode, the organic material functional layer 8 and the first electrode 10 in a same subpixel unit 21, 22 or 23 constitute a microcavity structure.

In the manufacturing method provided by the embodiment of the present invention, the plurality of pixel units 2 are formed on the substrate 1; a thickness of the composite electrodes of different types of subpixel units 21, 22, 23 in the plurality of pixel units 2 is different; and the composite electrode, the organic material functional layer 8 and the first electrode 10 in a same subpixel unit 21, 22 or 23 constitute a microcavity structure. Thus, a thickness of the microcavity structures of different types of subpixel units 21, 22 or 23 is different. The manufacturing process of the microcavity structures is simple and the array substrate can be easily produced, so that the manufacturing cost can be reduced and the production efficiency and the yield can be improved.

In one embodiment of the present invention, for instance, the plurality of pixel units 2 comprise R, G and B subpixel units 21, 22, 23. As the wavelength of light emitted by the R, G and B subpixel units 21, 22, 23 is different from each other, a thickness of three types of microcavity structures corresponding to the R, G and B subpixel units 21, 22, 23 also should be different. The three types of microcavity structures are configured to improve the color purity and the intensity of light emitted by corresponding subpixel units 21, 22, 23.

As illustrated in FIGS. 1 and 2, for instance, the organic material functional layers 8 of the R, G and B subpixel units 21, 22, 23 are respectively red (R) organic material functional layers 81, green (G) organic material functional layers 82 and blue (B) organic material functional layers 83; the R organic material functional layer 81 is disposed on the R second electrode 4 of the R subpixel unit 21; the G organic material functional layer 82 is disposed on the G second electrode 4 of the G subpixel unit 22; the B organic material functional layer 83 is disposed on the B second electrode 4 of the B subpixel unit 23; the R organic material functional layer 81 is configured to emit red light; the G organic material functional layer 82 is configured to emit green light; and the B organic material functional layer 83 is configured to emit blue light. The three subpixel units 21, 22, 23 improve the color purity and the intensity of light emitted by corresponding organic material functional layers 8. For instance, due to the microcavity effect of the R subpixel unit 21, the color purity and the intensity of the red light emitted by the R organic material functional layer 81 are improved.

The manufacturing method provided by the embodiment can be used for manufacturing top-emission and bottom-emission OLED array substrates.

Figure 5:
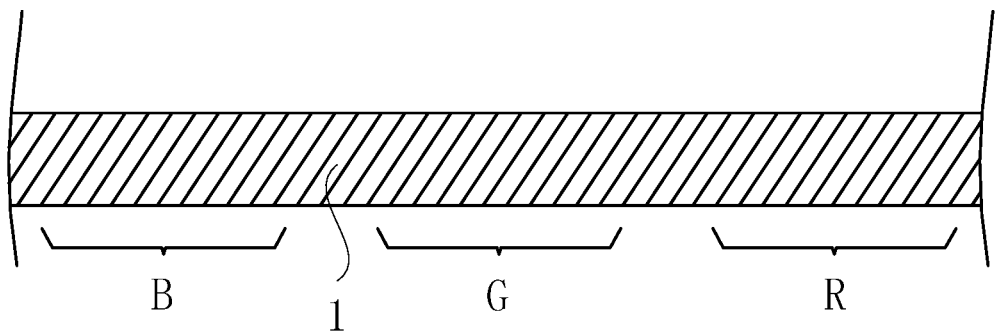
FIGS. 5 to 25 are schematic diagrams of a method for manufacturing an OLED array substrate, provided by the embodiments.

The method for manufacturing the top-emission OLED array substrate is as follows:

For instance, as illustrated in FIG. 5, the substrate 1 comprises a first region R for accommodating the R subpixel units 21, a second region G for accommodating the G subpixel units 22, and a third region B for accommodating the B subpixel units 23.

Figure 6:
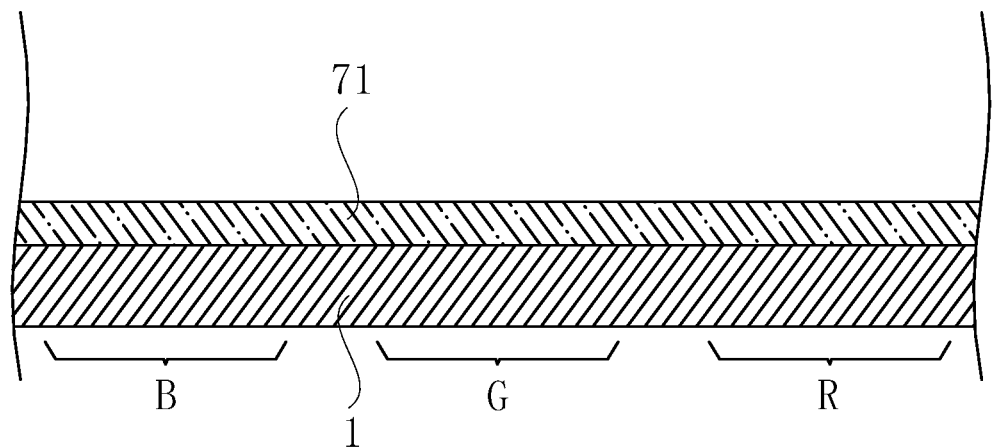
Figure 7:
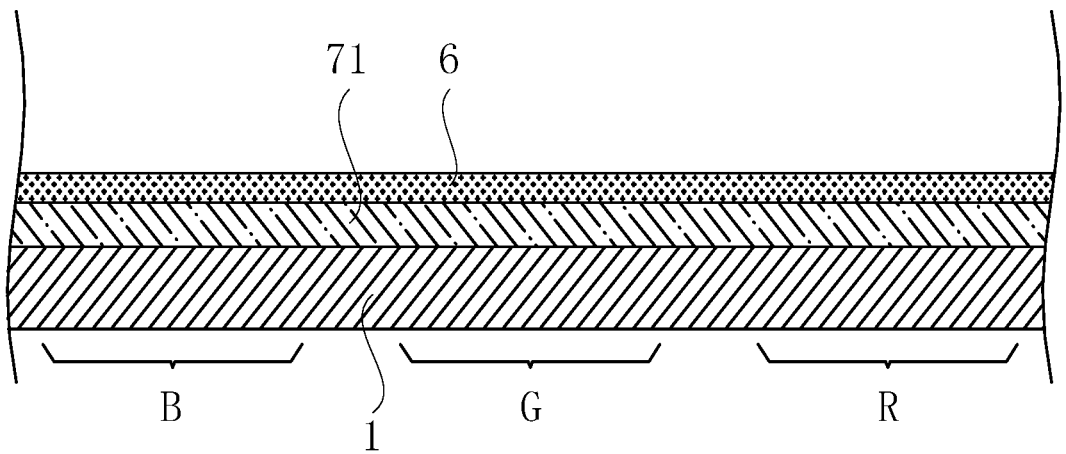
Figure 8:
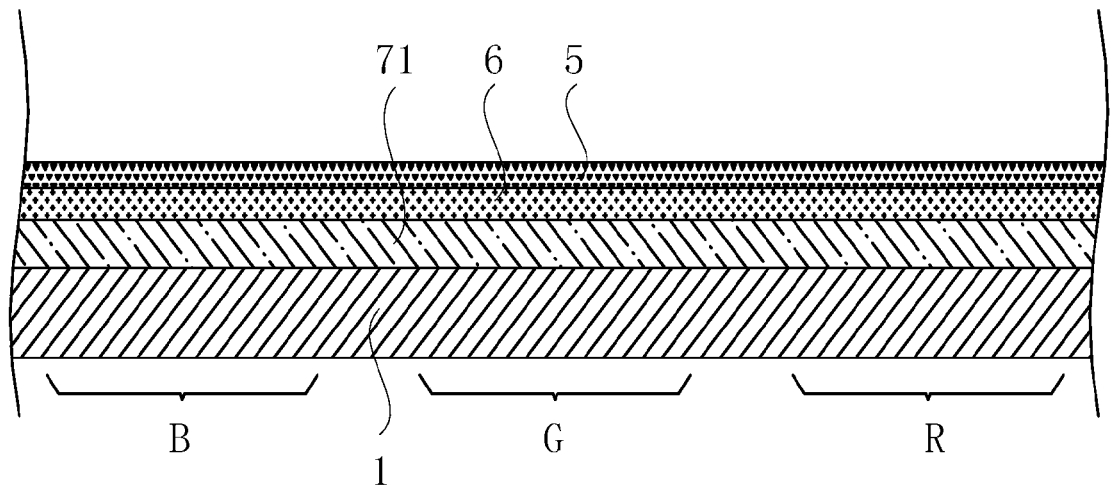
Figure 9:
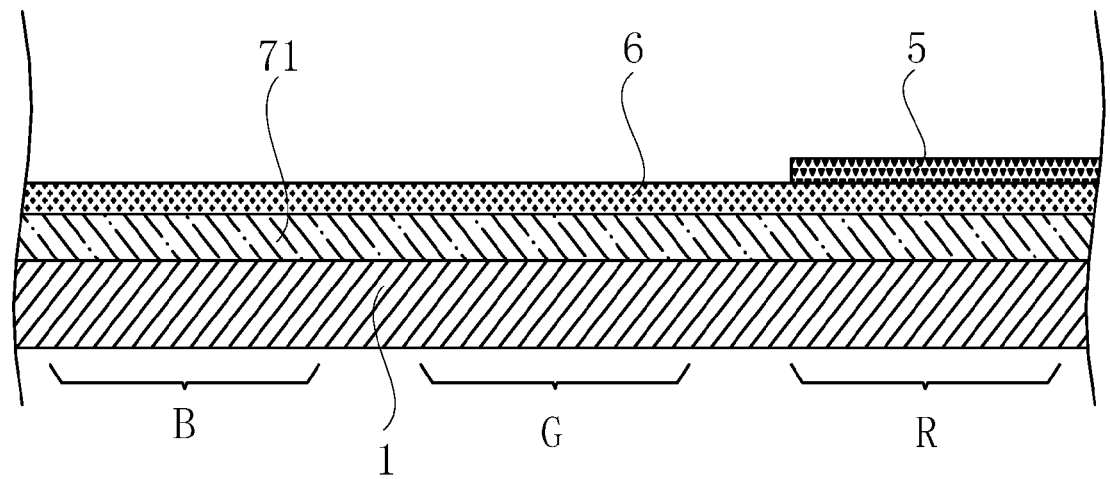
Figure 10:
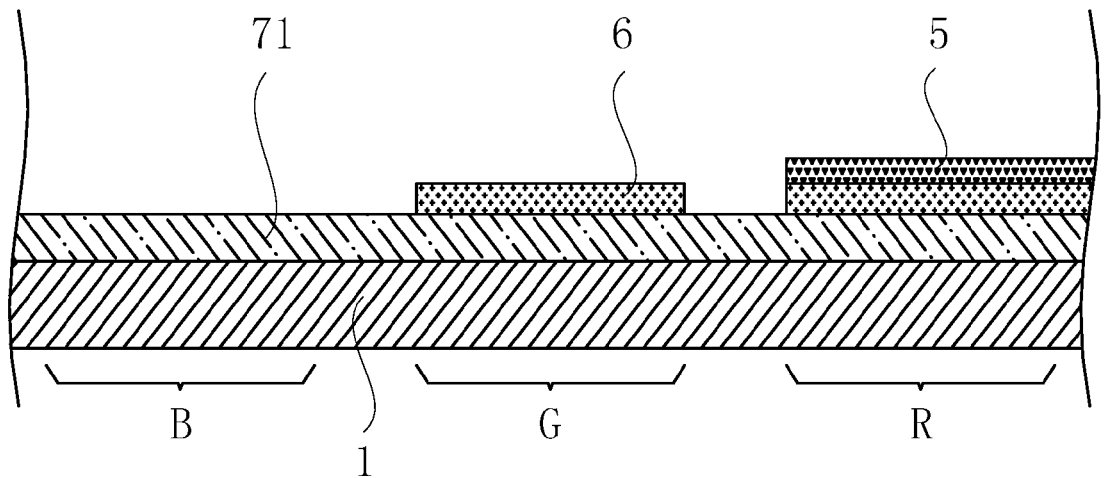
Figure 11:
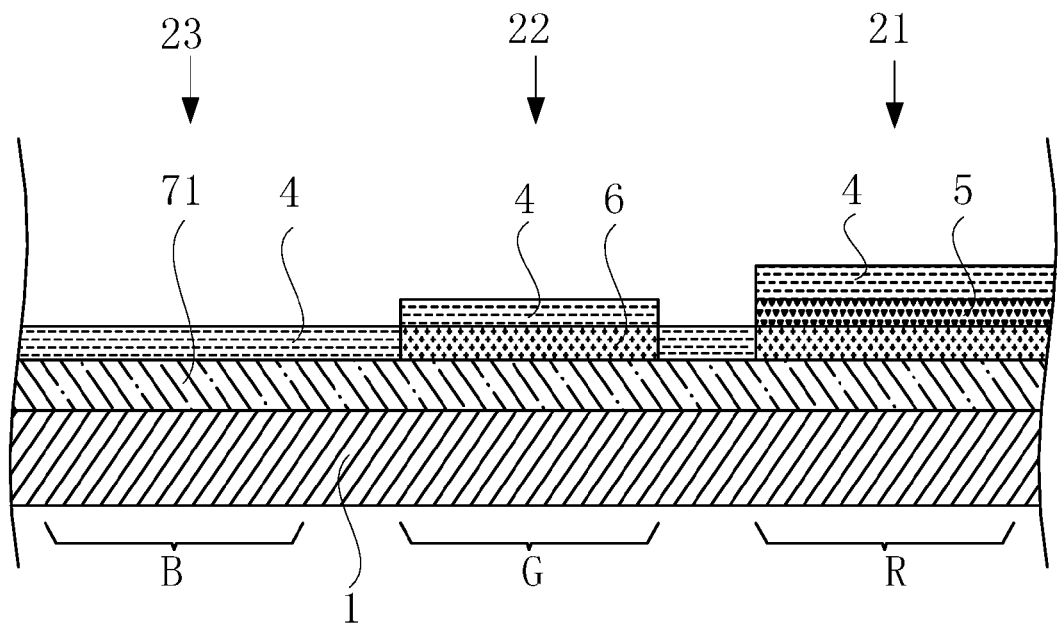

The step of forming the composite electrodes on the substrate 1 includes:

as illustrated in FIGS. 6 to 8, forming a reflecting layer 71 on the substrate 1, forming a second microcavity adjustment layer 6 on the reflecting layer 71, and forming a first microcavity adjustment layer 5 on the second microcavity adjustment layer 6;

as illustrated in FIG. 9, etching the first microcavity adjustment layer 5 disposed on the second region G and the third region B, and exposing the second microcavity adjustment layer 6 on the second region G and the third region B;

as illustrated in FIG. 10, etching the second microcavity adjustment layer 6 disposed on the third region B, and exposing the reflecting layer 71 on the third region B; and as illustrated in FIG. 11, forming a second electrodes 4 on the first microcavity adjustment layer 5 disposed on the first region R, on the second microcavity adjustment layer 6 disposed on the second region G, and on the reflecting layer 71 disposed on the third region B.

In the embodiment, in order to form the composite electrodes of the three subpixel units 21, 22, 23 with different thicknesses on the substrate 1, the first microcavity adjustment layer 5 disposed on the second region G and the third region B is etched and the second microcavity adjustment layer 6 disposed on the third region B is etched, so that the thickness of the composite electrodes of the R subpixel unit 21, the G subpixel unit 22 and the B subpixel unit 23 can be different, and hence the array substrate can be easily obtained.

In order to simplify the manufacturing process, as illustrated in FIG. 9, when the first microcavity adjustment layer 5 is etched, the first microcavity adjustment layer 5 disposed on a junction of the first region R and the second region G and the first microcavity adjustment layer 5 disposed on a junction of the second region G and the third region B may be simultaneously etched, and the second microcavity adjustment layer 6 is exposed; and as illustrated in FIG. 10, when the second microcavity adjustment layer 6 is etched, the second microcavity adjustment layer 6 disposed on the junction of the first region R and the second region G and the second microcavity adjustment layer 6 disposed on the junction of the second region G and the third region B may be simultaneously etched, and the reflecting layer 71 is exposed.

For instance, the first electrode 10 is a transflective layer 73. The light emitted by the organic material functional layer 8 may emit from the first electrode 10, namely emit from the transflective layer 73. The light emitted by the organic material functional layer 8 cannot emit from the reflecting layer 71. The structure is a top-emission OLED array substrate.

As illustrated in FIG. 15, in order to conduct the R reflecting layer 71 and the R second electrode 4 of the R subpixel unit 21, before forming the second electrode 4 on the first microcavity adjustment layer 5, the first microcavity adjustment layer 5 and the second microcavity adjustment layer 6 should be etched to form a through hole; the reflecting layer 71 is exposed from the through hole; the R conductive layer 9 is formed in the through hole; and when the reflecting layer 71 is electrified, the R conductive layer 9 is configured to conduct the R reflecting layer 71 and the R second electrode 4. In order to conduct the G reflecting layer 71 and the G second electrode 4 of the G subpixel unit 22, before forming the second electrode 4 on the second microcavity adjustment layer 6, the second microcavity adjustment layer 6 should be subjected to through-hole etching to form a through hole; the G reflecting layer 71 is exposed from the through hole; the G conductive layer 9 is formed in the through hole; and when the G reflecting layer 71 is electrified, the G conductive layer 9 is configured to conduct the G reflecting layer 71 and the G second electrode 4.

Figure 14:
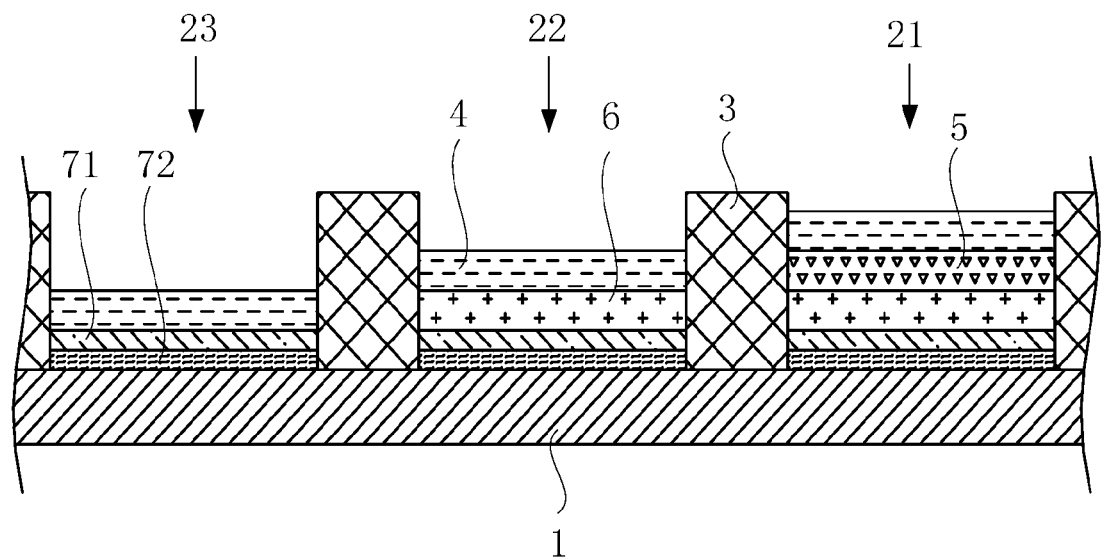

As illustrated in FIG. 14, for instance, before forming the reflecting layer 71 on the substrate 1, the manufacturing method further comprises:

forming a connecting layer 72 on the substrate 1, wherein, the bonding strength between the reflecting layer 71 and the substrate 1 can be enhanced by the connecting layer 72, so that the reflecting layer 71 can be more stably connected to the substrate 1.

In one embodiment of the present invention, for instance, as illustrated in FIG. 5, the substrate 1 includes a first region R for accommodating the R subpixel units 21, a second region G for accommodating the G subpixel units 22, and a third region B for accommodating the B subpixel units 23.

Figure 16:
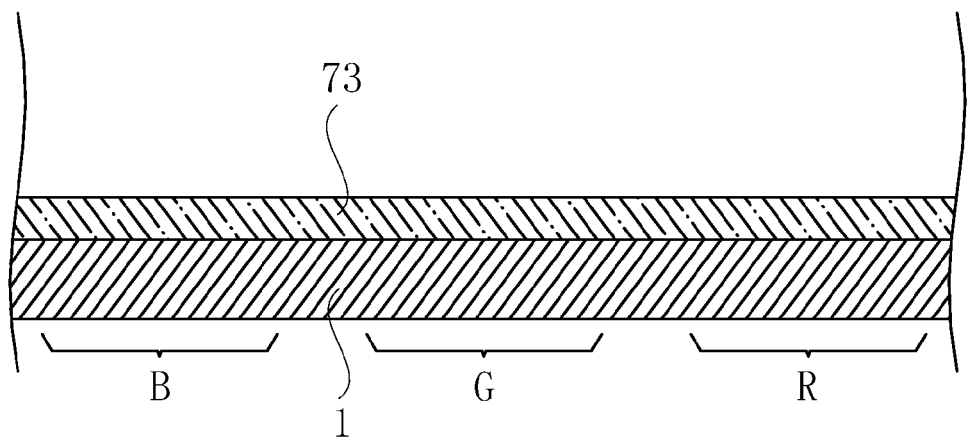
Figure 17:
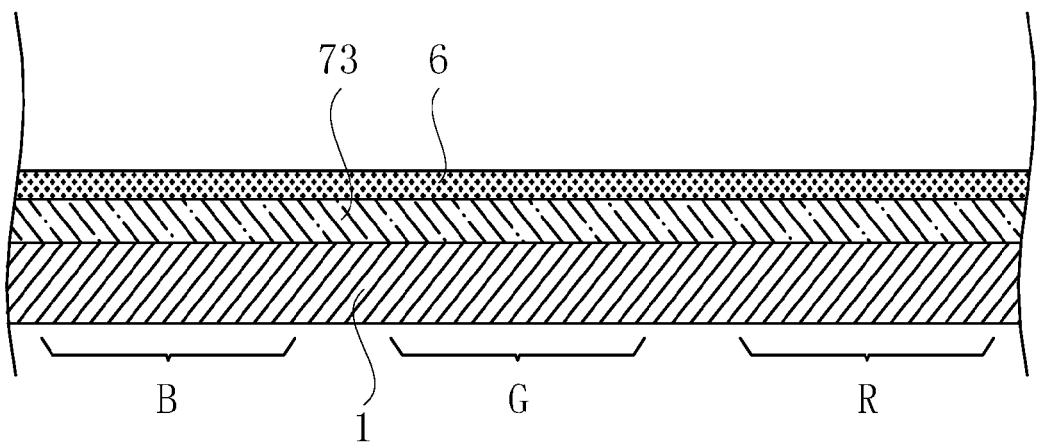
Figure 18:
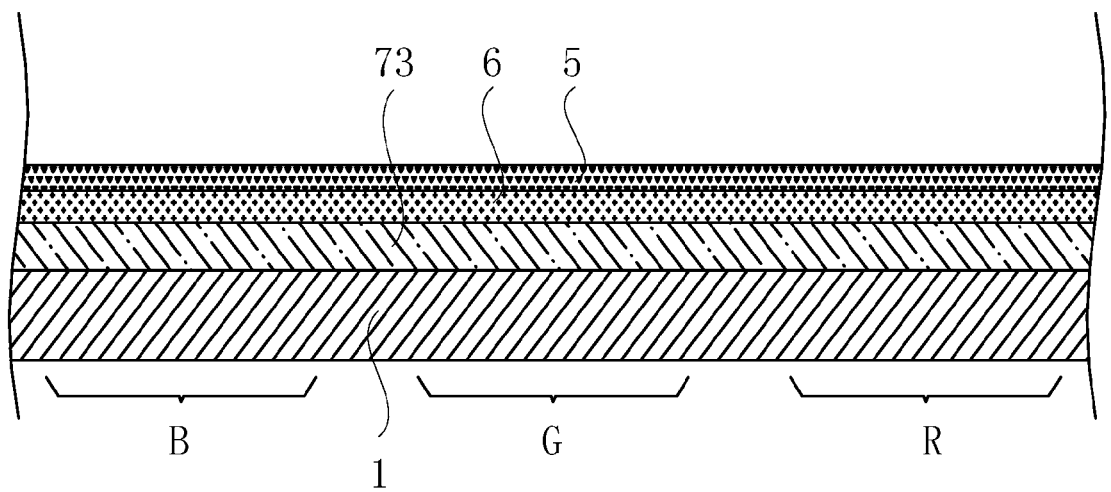
Figure 19:
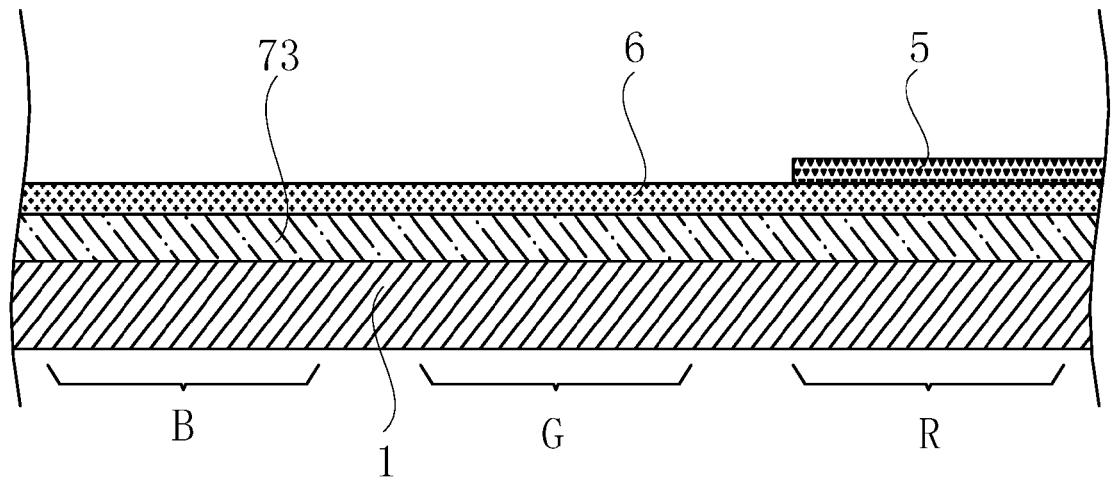
Figure 20:
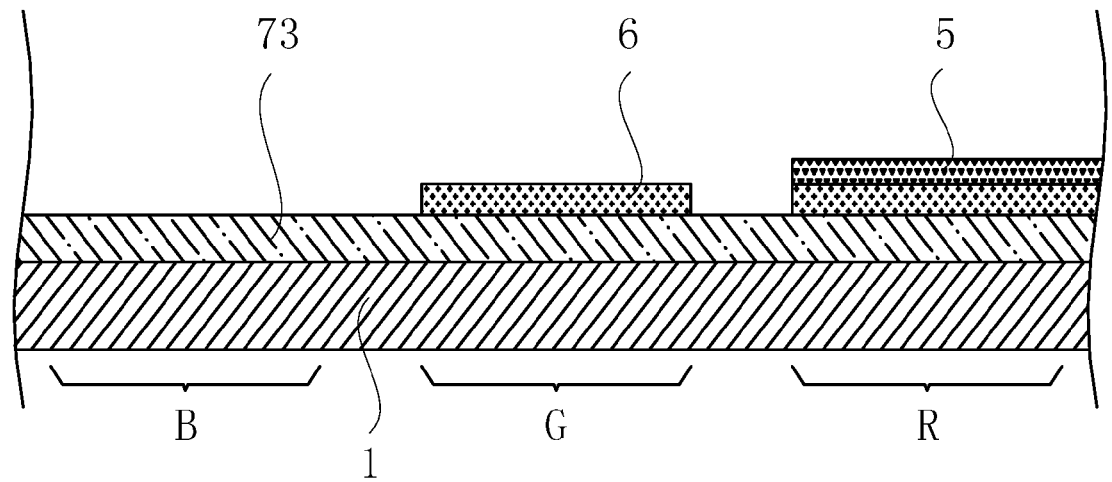
Figure 21:
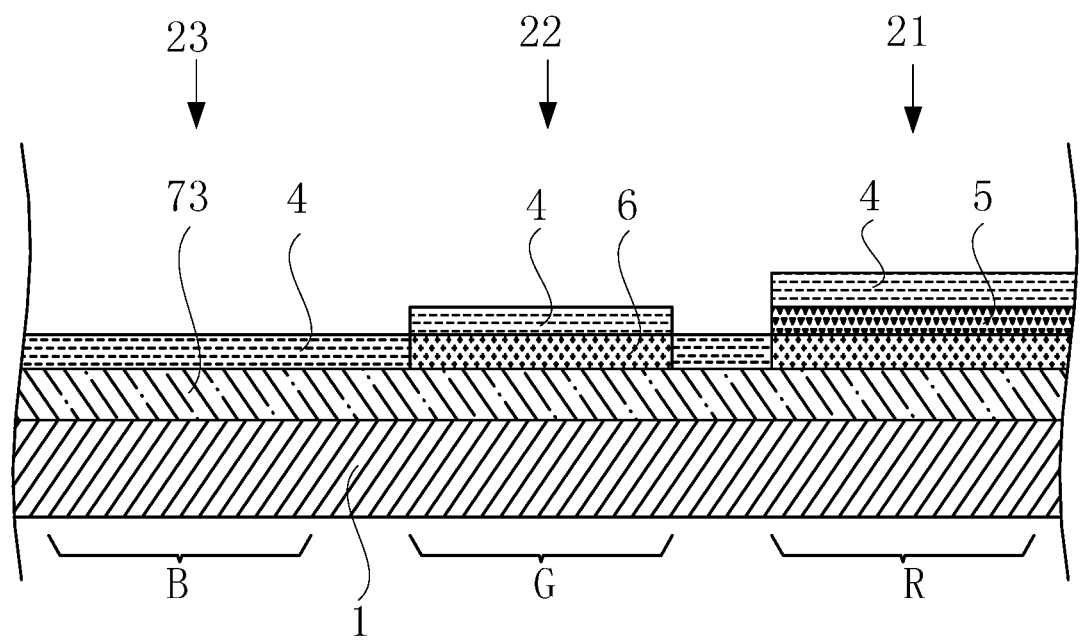

Forming the composite electrodes on the substrate 1 includes:

as illustrated in FIGS. 16 to 18, forming a transflective layer 73 on the substrate 1, forming a second microcavity adjustment layer 6 on the transflective layer 73, and forming a first microcavity adjustment layer 5 on the second microcavity adjustment layer 6;

as illustrated in FIG. 19, etching the first microcavity adjustment layer 5 disposed on the second region G and the third region B, and exposing the second microcavity adjustment layer 6 on the second region G and the third region B;

as illustrated in FIG. 20, etching the second microcavity adjustment layer 6 disposed on the third region B, and exposing the transflective layer 73 on the third region B; and as illustrated in FIG. 21, forming a second electrodes 4 on the first microcavity adjustment layer 5 disposed on the first region R, on the second microcavity adjustment layer 6 disposed on the second region G, and on the transflective layer 73 disposed on the third region B.

In the embodiment, in order to form the composite electrodes of the three subpixel units 21, 22, 23 with different thicknesses on the substrate 1, the first microcavity adjustment layer 5 disposed on the second region G and the third region B is etched and the second microcavity adjustment layer 6 disposed on the third region B is etched, so that a thickness of the composite electrodes of the R subpixel unit 21, the G subpixel unit 22 and the B subpixel unit 23 can be different, and hence the array substrate can be easily produced.

In order to simplify the manufacturing process, as illustrated in FIG. 19, when the first microcavity adjustment layer 5 is etched, the first microcavity adjustment layer 5 disposed on a junction of the first region R and the second region G and the first microcavity adjustment layer 5 disposed on a junction of the second region G and the third region B may be simultaneously etched, and the second microcavity adjustment layer 6 is exposed; and as illustrated in FIG. 20, when the second microcavity adjustment layer 6 is etched, the second microcavity adjustment layer 6 disposed on the junction of the first region R and the second region G and the second microcavity adjustment layer 6 disposed on the junction of the second region G and the third region B may be simultaneously etched, and the transflective layer 73 is exposed.

For instance, the first electrode 10 is a reflecting layer 71. The light emitted by the organic material functional layer 8 may emit from the transflective layer 73 and cannot emit from the first electrode 10. The structure is a bottom-emission OLED array substrate.

As illustrated in FIG. 25, in order to conduct the R transflective layer 73 and the R second electrode 4 of the R subpixel unit 21, before forming the second electrode 4 on the first microcavity adjustment layer 5, the first microcavity adjustment layer 5 and the second microcavity adjustment layer 6 must be etched to form a through hole; the transflective layer 73 is exposed from the through hole; the R conductive layer 9 is formed in the through hole; and when the R transflective layer 73 is electrified, the R conductive layer 9 is configured to conduct the R transflective layer 73 and the R second electrode 4. In order to conduct the G transflective layer 73 and the G second electrode 4 of the G subpixel unit 22, before forming the second electrode 4 on the second microcavity adjustment layer 6, the second microcavity adjustment layer 6 should be etched to form a through hole; the transflective layer 73 is exposed from the through hole; the G conductive layer 9 is formed in the through hole; and when the G transflective layer 73 is electrified, the G conductive layer 9 is configured to conduct the G transflective layer 73 and the G second electrode 4.

Figure 24:
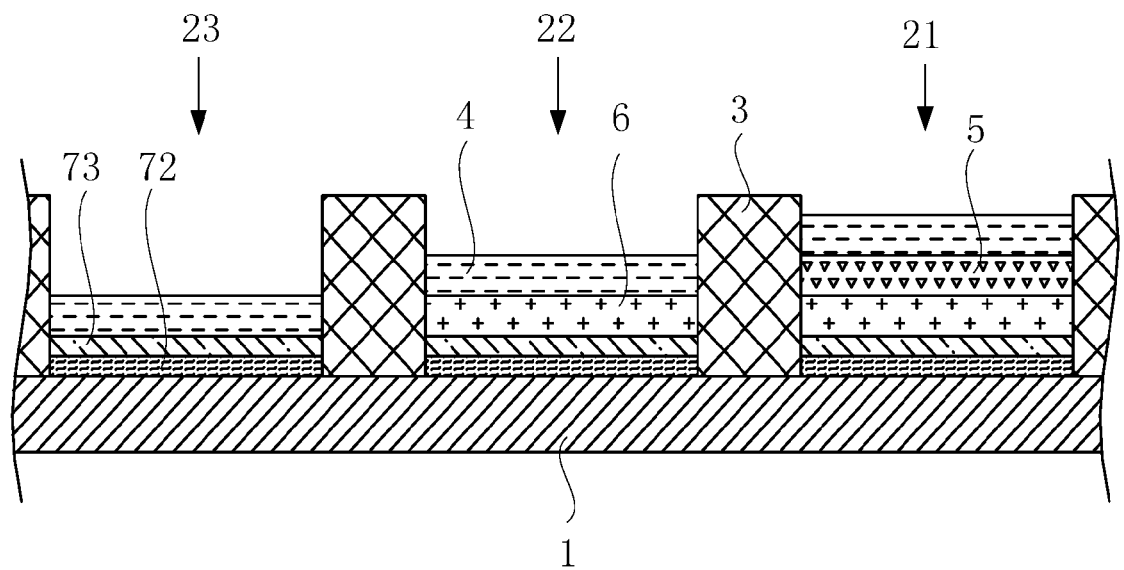

As illustrated in FIG. 24, for instance, before forming the transflective layer 73 on the substrate 1, the manufacturing method further comprises:

forming a connecting layer 72 on the substrate 1, wherein, the bonding strength between the transflective layer 73 and the substrate 1 can be enhanced by the connecting layer 72, so that the transflective layer 73 can be more stably connected to the substrate 1.

In the embodiment, the number of the structural layers of the G subpixel unit 23 is minimum; the number of the structural layers of the G subpixel unit 22 is greater than the number of the structural layers of the B subpixel unit 23; and the number of the structural layers of the R subpixel unit 21 is maximum. Three types of microcavity structures with different thicknesses corresponding to the R, G and B subpixel units can be obtained due to different numbers of the structural layers of the R, G and B subpixel units 21, 22, 23.

In the embodiment, when the plurality of subpixel units 21, 22, 23 are formed on the substrate 1, firstly, the reflecting layer 71 or the transflective layer 73 is sputtered on the substrate 1; secondly, the second microcavity adjustment layer 6 and the first microcavity adjustment layer 5 are deposited on the substrate 1 in sequence; thirdly, the first microcavity adjustment layer 5 in the B subpixel units 23 and the G subpixel units 22 is etched, and the second microcavity adjustment layer 6 in the B subpixel units 23 and the G subpixel units 22 is exposed; fourthly, the first microcavity adjustment layer 5 in the B subpixel units 23 is etched, and the reflecting layer 71 or the transflective layer 73 is exposed; and finally, the second electrodes 4 are sputtered on the substrate 1. As can be seen, in the embodiment, as multi-layered structures are formed on the substrate 1, a thickness of the composite electrodes of different subpixel units 21, 22, 23 is different. Therefore, the OLED array substrate provided by the embodiment can be easily obtained in process, and as a result, the manufacturing cost is reduced and the production efficiency and the yield are improved.

For instance, a material of the connecting layer 72 comprises a metal oxide.

For instance, a metal oxide material of the connecting layer 72 comprises ITO or IZO.

For instance, a thickness of the connecting layer 72 is less than or equal to 20 nm.

For instance, a thickness of the transflective layer is less than or equal to 20 nm.

For instance, a thickness of the reflecting layer 71 is greater than 50 nm.

For instance, the first microcavity adjustment layer 5 is made from metal oxide, and the second microcavity adjustment layer 5 is made from inorganic passivation layer materials. Wherein, the inorganic passivation layer material of the second microcavity adjustment layer 6 includes a silicon oxide or a silicon nitride, and the metal oxide of the first microcavity adjustment layer 5 includes ITO or IZO. As the above materials are adopted, the index of refraction of the first microcavity adjustment layer 5 and the index of refraction of the second microcavity adjustment layer 6 are very close to each other and are ranged from 1.9 to 2.1.

For instance, a material of the second electrode 4 comprises a metal oxide.

For instance, a metal oxide material of the second electrode 4 comprises ITO or IZO.

For instance, a material of the reflecting layer 71 comprises metallic materials, and the metallic materials in the reflecting layer 71 shall have high reflectivity.

For instance, the material of the reflecting layer 71 is one metal selected from silver, tungsten and aluminum.

Figure 12:
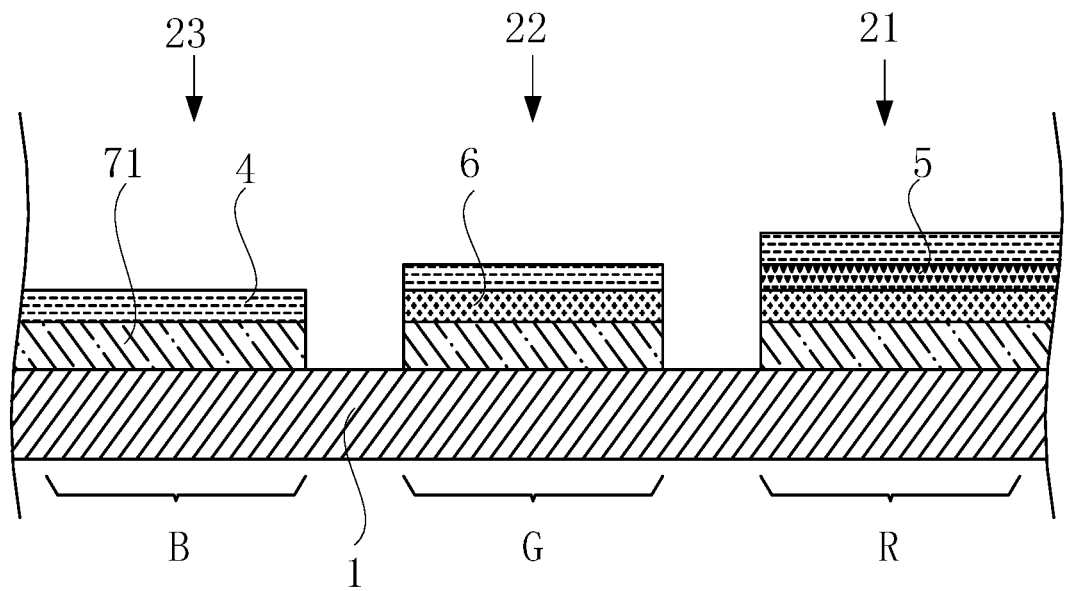
Figure 13:
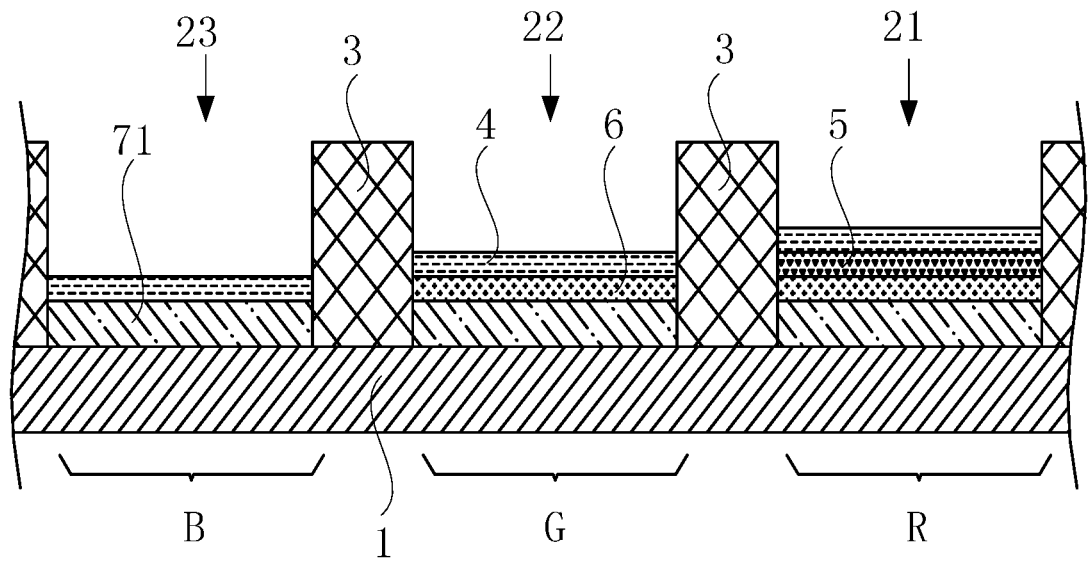
Figure 22:
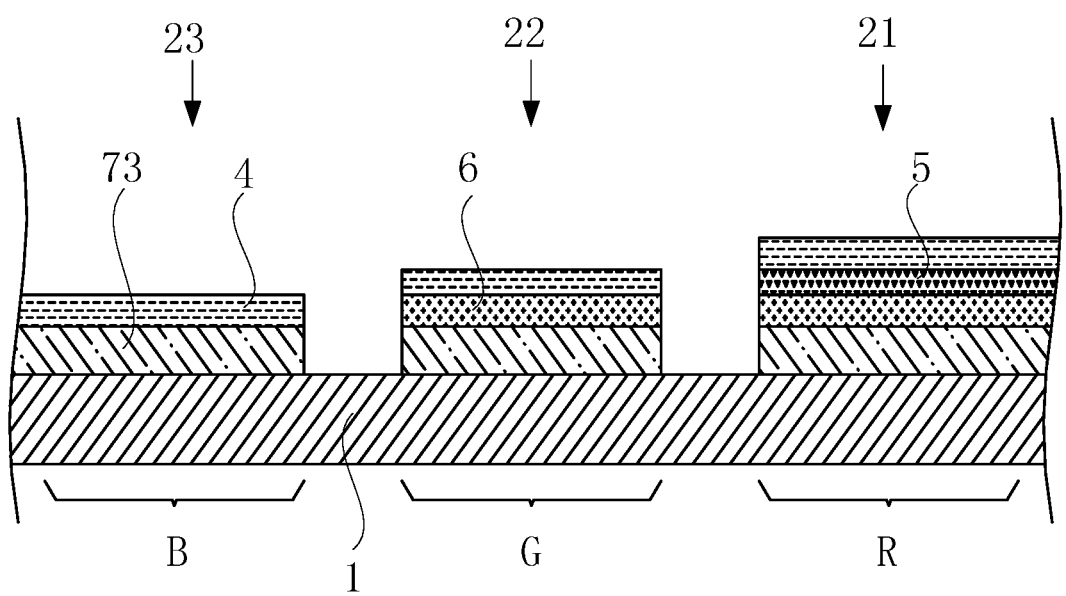
Figure 23:
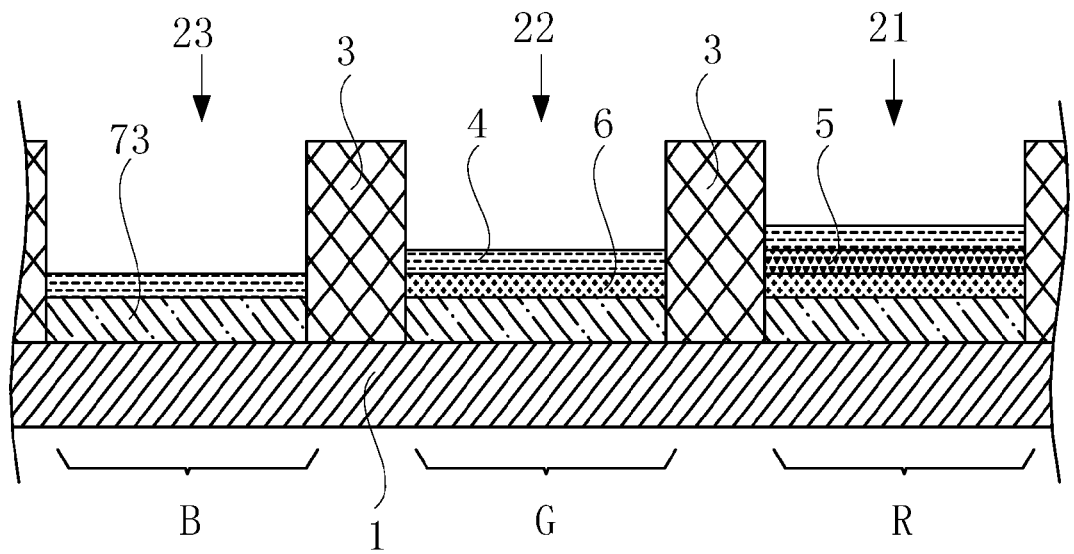

For instance, before forming the organic material functional layers 8 on the composite electrodes, the manufacturing method further comprises:

separating any two adjacent subpixel units by etching, and exposing the substrate 1, as shown in FIGS. 12 and 22; and forming a PDL on the exposed substrate 1, as shown in FIGS. 13 and 23.

For instance, both the conductive layers 9 in the R subpixel unit 21 and the G subpixel unit 22 are bonded to the pixel defining unit 3, and the distance between the conductive layers 9 and the pixel defining unit 3 is as smaller as possible. The size of an upper end of the pixel defining unit 3 is greater than that of a lower end of the pixel defining unit 3, so that the conductive layers 9 in the R subpixel unit 21 and the G subpixel unit 22 can be shielded, and hence the uniformity of light running through the R subpixel unit 21 and the G subpixel unit 22 can be improved.

For instance, a material of the conductive layer 9 may be the same with that of the second electrode 4.

For instance, the substrate 1 may be a TFT substrate.

In the method for manufacturing the OLED array substrate provided by the present embodiment, firstly, the reflecting layer 71 (or the transflective layer 73), the second microcavity adjustment layer 6 and the first microcavity adjustment layer 5 are formed on the substrate 1 in sequence; secondly, the first microcavity adjustment layer 5 in the G subpixel units 22 and the B subpixel units 23 is etched; and thirdly, the second microcavity adjustment layer 6 in the B subpixel units 23 is etched. Thus, a thickness of the composite electrodes of the R subpixel units 21, the G subpixel units 22 and the B subpixel units 23 can be different, and hence the thickness of the microcavity structures of the R subpixel units 21, the G subpixel units 22 and the B subpixel units 23 can be different. Therefore, the microcavity structures formed by the manufacturing method can be easily obtained, and hence the manufacturing cost can be reduced and the production efficiency and the yield can be improved.

What are described above is related to the illustrative embodiments of the disclosure only and not limitative to the scope of the disclosure; the scopes of the disclosure are defined by the accompanying claims.

The present application claims the priority of the Chinese Patent Application No. 201610101909.5 filed on Feb. 24, 2016, which is incorporated herein by reference as part of the disclosure of the present application.

The invention claimed is:

1. An organic light-emitting diode (OLED) array substrate, comprising:
a substrate and pixel units disposed on the substrate, wherein
each pixel unit comprises a plurality of subpixel units; each subpixel unit comprises a composite electrode, an organic material functional layer and a first electrode sequentially disposed on the substrate; thicknesses of composite electrodes of the subpixel units are different; and
the composite electrode, the organic material functional layer and the first electrode in a same subpixel unit constitute a microcavity structure;
the plurality of subpixel units comprise a red (R) subpixel unit, a green (G) subpixel unit, and a blue (B) subpixel unit;
the composite electrode of the R subpixel unit comprises an R second electrode, an R first microcavity adjustment layer, an R second microcavity adjustment layer and an R reflecting layer sequentially disposed on the substrate;
the composite electrode of the G subpixel unit comprises a G second electrode, a G second microcavity adjustment layer and a G reflecting layer sequentially disposed on the substrate;
the composite electrode of the B subpixel unit comprises a B second electrode and a B reflecting layer sequentially disposed on the substrate; and
the first electrode is a transflective layer.

2. The array substrate according to claim 1, wherein the composite electrode of the R subpixel unit comprises an R second electrode, an R first microcavity adjustment layer, an R second microcavity adjustment layer and an R transflective layer sequentially disposed on the substrate;
the composite electrode of the G subpixel unit comprises a G second electrode, a G second microcavity adjustment layer and a G transflective layer sequentially disposed on the substrate;
the composite electrode of the B subpixel unit comprises a B second electrode and a B transflective layer sequentially disposed on the substrate; and
the first electrode is a reflecting layer.

3. The array substrate according to claim 2, wherein each subpixel unit further comprises a connecting layer; and the connecting layer is bonded to the substrate.

4. The array substrate according to claim 2, wherein a material of the first microcavity adjustment layer comprises a metal oxide, and a material of the second microcavity adjustment layer comprises an inorganic passivation layer material.

5. The array substrate according to claim 1, wherein each subpixel unit further comprises a connecting layer; and the connecting layer is bonded to the substrate.

6. The array substrate according to claim 5, wherein a material of the connecting layer comprises metal oxide.

7. The array substrate according to claim 1, wherein a material of the first microcavity adjustment layer comprises a metal oxide, and a material of the second microcavity adjustment layer comprises an inorganic passivation layer material.

8. The array substrate according to claim 1, further comprising: a pixel define layer (PDL) disposed on the substrate and configured to separate any two adjacent subpixel units.

9. A display device, comprising an organic light-emitting diode (OLED) array substrate according to claim 1.

10. A manufacturing method of an organic light-emitting diode (OLED) array substrate, comprising:
forming a plurality of subpixel units on a substrate, wherein,
each subpixel unit comprises a composite electrode formed on the substrate, an organic material functional layer formed on the composite electrode, and a first electrode formed on the organic material functional layer; thicknesses of composite electrodes of the subpixel units are different; and
the composite electrode, the organic material functional layer and the first electrode in a same subpixel unit constitute a microcavity structure;
the plurality of subpixel units comprise a red (R) subpixel unit, a green (G) subpixel unit, and a blue (B) subpixel unit;
the substrate comprises a first region for accommodating the R subpixel unit, a second region for accommodating the G subpixel unit and a third region for accommodating the B subpixel unit;
forming the composite electrodes on the substrate includes:
forming a reflecting layer on the substrate, forming a second microcavity adjustment layer on the reflecting layer, and forming a first microcavity adjustment layer on the second microcavity adjustment layer;
etching the first microcavity adjustment layer located in the second region and the third region, and exposing the second microcavity adjustment layer located in the second region and the third region;

etching the second microcavity adjustment layer located in the third region, and exposing the reflecting layer located in the third region; and forming a second electrode on the first microcavity adjustment layer located in the first region, on the second microcavity adjustment layers located in the second region, and on the reflecting layers located in the third region; and the first electrode is a transflective layer.

11. The manufacturing method according to claim 10, before forming the reflecting layer on the substrate, further comprising: forming a connecting layer on the substrate.

12. The manufacturing method according to claim 10, wherein the substrate comprises a first region for accommodating the R subpixel unit, a second region for accommodating the G subpixel unit and a third region for accommodating the B subpixel unit;

forming the composite electrodes on the substrate includes:

forming a transflective layer on the substrate, forming a second microcavity adjustment layer on the transflective layer, and forming a first microcavity adjustment layer on the second microcavity adjustment layer;

etching the first microcavity adjustment layer located in the second region and the third region, and exposing the second microcavity adjustment layer located in the second region and the third region;

etching the second microcavity adjustment layer located in the third region, and exposing the transflective layer located in the third region; and forming a second electrode on the first microcavity adjustment layer located in the first region, on the second microcavity adjustment layer located in the second region, and on the transflective layer located in the third region; and the first electrode is a reflecting layer.

13. The manufacturing method according to claim 12, before forming the transflective layer on the substrate, further comprising: forming a connecting layer on the substrate.

14. The manufacturing method according to claim 11, wherein a material of the connecting layer comprises a metal oxide.

15. The manufacturing method according to claim 10, wherein a material of the first microcavity adjustment layer comprises a metal oxide, and a material of the second microcavity adjustment layer comprises an inorganic passivation layer material.

16. The manufacturing method according to claim 10, before forming the organic material functional layer on the composite electrode, further comprising:

separating any two adjacent subpixel units by etching, and exposing the substrate; and forming a pixel define layer (PDL) on the exposed substrate.

* * * * *